(12) United States Patent
Fritzemeier et al.

(10) Patent No.: US 6,893,732 B1
(45) Date of Patent: May 17, 2005

(54) MULTI-LAYER ARTICLES AND METHODS OF MAKING SAME

(75) Inventors: Leslie G. Fritzemeier, Mendon, MA (US); Wei Zhang, Shrewsbury, MA (US); Walter C. Palm, Pawtucket, RI (US); Martin W. Rupich, Framingham, MA (US)

(73) Assignee: American Superconductor Corporation, Westborough, MA (US)

( * ) Notice: Subject to any disclaimer, the term of this patent is extended or adjusted under 35 U.S.C. 154(b) by 479 days.

(21) Appl. No.: 09/616,810

(22) Filed: Jul. 14, 2000

Related U.S. Application Data

(60) Provisional application No. 60/166,297, filed on Nov. 18, 1999, provisional application No. 60/166,140, filed on Nov. 18, 1999, provisional application No. 60/166,145, filed on Nov. 18, 1999.

(51) Int. Cl.[7] .............................. B22F 7/00; B22F 7/02; B23K 35/36
(52) U.S. Cl. ..................... 428/548; 505/230; 204/59 R
(58) Field of Search ..................... 174/125.1; 505/230, 505/231; 204/59 R; 428/548–565

(56) References Cited

U.S. PATENT DOCUMENTS

| | | | |
|---|---|---|---|
| 3,763,552 | A | 10/1973 | Brown et al. |
| 3,985,281 | A | 10/1976 | Diepers et al. |
| 4,442,396 | A | 4/1984 | Hucker |
| 4,508,887 | A * | 4/1985 | Kohl ........................... 528/21 |
| 4,639,298 | A * | 1/1987 | Kreh et al. ................. 205/447 |
| 4,659,973 | A | 4/1987 | Stich |
| 4,670,108 | A * | 6/1987 | Kreh et al. ................. 205/447 |
| 4,692,227 | A * | 9/1987 | Spotnitz et al. ............ 205/688 |
| 4,859,652 | A | 8/1989 | Block |
| 4,882,312 | A | 11/1989 | Mogro-Campero et al. |
| 4,956,340 | A | 9/1990 | Kimura et al. |
| 4,959,347 | A | 9/1990 | Kobayashi et al. |
| 4,994,433 | A | 2/1991 | Chiang |
| 4,994,435 | A | 2/1991 | Shiga et al. |
| 5,038,127 | A | 8/1991 | Dersch |
| 5,071,828 | A | 12/1991 | Greuter et al. |
| 5,073,537 | A | 12/1991 | Hung et al. |
| 5,229,358 | A | 7/1993 | Kumar |
| 5,231,074 | A * | 7/1993 | Cima et al. ................. 505/434 |
| 5,236,890 | A | 8/1993 | Murakami et al. |
| 5,304,533 | A | 4/1994 | Kobayashi et al. |

(Continued)

FOREIGN PATENT DOCUMENTS

EP 0308869 9/1988

(Continued)

OTHER PUBLICATIONS

Beach et al., "Sol-Gel Synthesis of Rare Earth Aluminate Films as Buffer Layers for High Tc Superconducting Films," Mat. Res. Soc. Symp. Proc., vol. 495, 263 (1997).

(Continued)

Primary Examiner—Kamand Cuneo
Assistant Examiner—Jeremy Norris
(74) Attorney, Agent, or Firm—Fish & Richardson P.C.

(57) ABSTRACT

The invention relates to superconductor articles, and compositions and methods for making superconductor articles. The methods can include using a precursor solution having a relatively small concentration of total free acid. The articles can include more than one layer of superconductor material in which at least one layer of superconductor material can be formed by a solution process, such as a solution process involving the use of metalorganic precursors.

30 Claims, 1 Drawing Sheet

U.S. PATENT DOCUMENTS

| | | | |
|---|---|---|---|
| 5,427,055 | A | 6/1995 | Ichikawa |
| 5,449,659 | A | 9/1995 | Garrison et al. |
| 5,484,766 | A | 1/1996 | Shah et al. |
| 5,571,603 | A | 11/1996 | Utumi et al. |
| 5,728,214 | A | 3/1998 | Konishi et al. |
| 5,741,377 | A | 4/1998 | Goyal et al. |
| 5,866,252 | A | 2/1999 | de Rochemont et al. |
| 5,958,599 | A | 9/1999 | Goyal et al. |
| 5,964,966 | A | 10/1999 | Goyal et al. |
| 5,968,877 | A | 10/1999 | Budai et al. |
| 5,981,445 | A | 11/1999 | Kirchnerova et al. |
| 6,022,832 | A | 2/2000 | Fritzemeier et al. |
| 6,027,564 | A | 2/2000 | Fritzemeier et al. |
| 6,077,344 | A | 6/2000 | Shoup et al. |
| 6,080,894 | A * | 6/2000 | Oyague et al. ............. 568/700 |
| 6,172,009 | B1 | 1/2001 | Smith et al. |
| 6,256,521 | B1 | 7/2001 | Lee et al. |
| 2002/0144838 | A1 * | 10/2002 | Fritzemeier et al. ..... 174/125.1 |

FOREIGN PATENT DOCUMENTS

| | | |
|---|---|---|
| EP | 0 387 525 | 9/1990 |
| EP | 0 431 782 | 6/1991 |
| EP | 0 584 410 | 3/1994 |
| EP | 0 872 579 | 10/1998 |
| EP | 0506582 A2 | 9/2002 |
| JP | 57075564 | 5/1982 |
| JP | 63310366 | 12/1988 |
| WO | WO 91/16149 | 10/1991 |
| WO | WO92/05591 | 4/1992 |
| WO | WO 98/58415 | 12/1993 |
| WO | WO 97/05669 | 2/1997 |
| WO | WO 99/16941 | 4/1999 |
| WO | WO 99/17307 | 4/1999 |
| WO | WO 99/25908 | 5/1999 |
| WO | WO 99/35083 | 7/1999 |
| WO | WO 01/98076 | 12/2001 |

OTHER PUBLICATIONS

Lee et al., "Alternative Buffer Architectures for High Critical Current Density YBCO Superconducting Deposits on Rolling Assisted Biaxially-Textured Substrates," Japanese J. Appl. Phys., vol. 38, L178 (1999).

Paranthaman et al., "Growth of Biaxially Textured $RE_2O_3$ Buffer Layers on Rolled-Ni Substrates Using Reactive Evaporation for HTS-Coated Conductors," Superconductor Sci. Tech., vol. 12, 319 (1999).

Rupich et al., "Growth and Characterization of Oxide Buffer Layers for YBCO Coated Conductors," IEEE Trans. on Appl. Superconductivity, vol. 9 (1999).

Shoup et al., "Epitaxial Thin Film Growth of Lanthanum and Neodymium Aluminate Films on Roll-Textured Nickel Using a Sol-Gel Method," J. Am. Cer. Soc., vol. 81, 3019 (1998).

"Silicon Processing for the VLSI Era," vol. 1, eds. S. Wolf and R.N. Tanber, Lattice Press, Sunset Park, CA, pp. 539-574 (1986).

Smith, J.A. et al., "High Critical Current Density Thick MOD-Derived YBCO Films," Transactions on Applied Superconductivity, vol. 9, No. 2, Jun. 1999.

G. Moore et al., "Sol-Gel Processing of $Y_1Ba_2Cu_3O_{7-x}$ Using Alkoxide Precursors: Two Systems Yielding High Degrees of Thin Film Orientation and Crystal Growth", Materials Letters, vol. 7, No. 12, Mar. 1989, pp. 415-424.

M.W. Rupich et al., "Synthesis of Superconductors from Soluble Metal Oxo Alkoxide Precursors", J. Mater. Res., vol. 8, No. 7, Jul. 1993, pp. 1487-1496.

Apicella, M.L. et al., "The Effects of Surface Contamination on the Biaxially Textured Substrate for YBCO Thick Film Deposition", International Journal of Modern Physics B, vol. 13, Nos. 9&10 (1999) 997-1004.

Boffa V. et al., "Laser-ablation deposition of $CeO_2$ thin films on biaxially textured nickel substrates", Physica C, vol. 312, (1999), pp. 202-212.

IBM Technical Disclosure Bulletin, "Fabrication of High Temperature Superconducting Films Using Perfluoro-Organometallic Precursors", vol. 32, No. 5B, Oct. 1989, p. 241.

McIntyre, Paul C. et al., "Effects of growth conditions on the properties and morphology of chemically derived epitaxial thin films of $Ba_2Ycu_3O_{7-x}$ on (001) $LaAlO_3$", J. Appl. Phys., vol. 71, No. 4, Feb. 15, 1992, pp. 1868-1877.

Qing He, D.K. et al., "Deposition of biaxially-oriented metal and oxide buffer-layer films on textured Ni tapes: new subtrates for high-current, high-temperature superconductors", Physica C, vol. 275 (1997) pp. 155-161.

Sheth, Atul et al., "Bench Scale Evaluation of Batch Mode Dip-Coating of Sol-Gel $LaAlO_3$ Buffer Material", IEEE Transactions on Applied Superconductivity, vol. 9, No. 2, Jun. 1999, pp. 1514-1518.

PCT Search Report dated Jun. 22, 2001.

Boffa, et al., "Laser-ablation deposition of CeO2 thin films on biaxially textured nickel subtrates".

Gupta, et al., "Superconducting oxide films with high transition temperature prepared from metal trifluoroacetate precursors".

McIntyre, et al., "Epitaxial nucleation and growth of chemically derived Ba2 Ycu3O7—x thin films on (001) SrTiO3".

He et al., "Growth of Biaxially Oriented Conductive $LaNiO_3$ Buffer Layers on Textured Ni Tapes for High-$T_c$-Coated Conductors,"Physica C 314 (1999) p. 105-111.

Koster et al., "fl Influence of the Surface Treatment on the Homoepitaxial Growth of $SrTiO_3$,"Materials Science & Engineering B56 (1998) p. 209-212.

Tanaka et al., "Improvement of $Yba_2Cu_3O_x$ Single-Crystal Surface by Chemical Etching,"Jpn. J. Appl. Phys. vol. 38 (1999) p. L731-L733.

* cited by examiner

MULTI-LAYER ARTICLES AND METHODS OF MAKING SAME

CROSS-REFERENCE TO RELATED APPLICATIONS

This application claims priority under 35 U.S.C. §119(e)(1) to commonly owned U.S. Provisional Patent Application Ser. No. 60/166,140; 60/166,145 and 60/166,297, filed Nov. 18, 1999, and entitled "Superconductor Articles and Compositions and Methods for Making Same," and claims benefit of provisional applications 60/166,140, filed Nov. 18, 1999 and 60/166,145, filed Nov. 18, 1999, which is hereby incorporated by reference.

This invention was made with Government support under Prime Contract No. DE-FG 02-97ER82324 awarded to American Superconductor Corporation by the Department of Energy. The Government has certain rights in this invention.

BACKGROUND OF THE INVENTION

The invention relates to superconductor articles, and compositions and methods for making superconductor articles.

Multi-layer articles can be used in a variety of applications. For example, superconductors, including oxide superconductors, can be formed of multi-layer articles. Typically, such superconductors include a layer of superconductor material and a layer, commonly referred to as a substrate, that can enhance the mechanical strength of the multi-layer article.

Generally, in addition to enhancing the strength of the multi-layer superconductor, the substrate should exhibit certain other properties For example, the substrate should have a low Curie temperature so that the substrate is not ferromagnetic at the superconductor's application temperature. Furthermore, chemical species within the substrate should not be able to diffuse into the layer of superconductor material, and the coefficient of thermal expansion of the substrate should be about the same as the superconductor material. Moreover, if the substrate is used for an oxide Superconductor, the substrate material should be relatively resistant to oxidation.

For some materials, such as yttrium-barium-copper-oxide (YBCO), the ability of the material to provide high transport current in its superconducting state depends upon the crystallographic orientation of the material. For example, such a material can exhibit a relatively high critical current density (Jc) when the surface of the material is biaxially textured.

As used herein, "biaxially textured" refers to a surface for which the crystal grains are in close alignment with a direction in the plane of the surface. One type of biaxially textured surface is a cube textured surface, in which the crystal grains are also in close alignment with a direction perpendicular to the surface. Examples of cube textured surfaces include the (100)[001] and (100)[011] surfaces, and an example of a biaxially textured surface is the (113)[211] surface.

For certain multi-layer superconductors, the layer of superconductor material is an epitaxial layer. As used herein, "epitaxial layer" refers to a layer of material whose crystallographic orientation is directly related to the crystallographic orientation of the surface of a layer of material onto which the epitaxial layer is deposited. For example, for a multi-layer superconductor having an epitaxial layer of superconductor material deposited onto a substrate, the crystallographic orientation of the layer of superconductor material is directly related to the crystallographic orientation of the substrate. Thus, in addition to the above-discussed properties of a substrate, it can be also desirable for a substrate to have a biaxially textured surface or a cube textured surface.

Some substrates do not readily exhibit all the above-noted features, so one or more intermediate layers, commonly referred to as buffer layers, can be disposed between the substrate and the superconductor layer. The buffer layer(s) can be more resistant to oxidation than the substrate, and reduce the diffusion of chemical species between the substrate and the superconductor layer. Moreover, the buffer layer(s) can have a coefficient of thermal expansion that is well matched with the superconductor material.

Typically, a buffer layer is an epitaxial layer, so its crystallographic orientation is directly related to the crystallographic orientation of the surface onto which the buffer layer is deposited. For example, in a multi-layer superconductor having a substrate, an epitaxial buffer layer and an epitaxial layer of superconductor material, the crystallographic orientation of the surface of the buffer layer is directly related to the crystallographic orientation of the surface of the substrate, and the crystallographic orientation of the layer of superconductor material is directly related to the crystallographic orientation of the surface of the buffer layer. Therefore, the superconducting properties exhibited by a multi-layer superconductor having a buffer layer can depend upon the crystallographic orientation of the buffer layer surface.

Precursor solutions containing excess acid have been used to prepare the superconductor material layer of multi-layer superconductors. However, the precursor solutions can affect certain surface conditions, such as smoothness, perfection and/or chemistry, of the substrate or the buffer layer on which the superconductor material layer is formed, which can reduce the superconducting properties exhibited by the multi-layer superconductor.

SUMMARY OF THE INVENTION

The invention relates to superconductor articles, and compositions and methods for making superconductor articles. The compositions can be superconductor precursor solutions that have relatively small amounts of total free acid. In aqueous solutions, this corresponds to a relatively neutral pH (i.e., neither strongly acidic nor strongly basic). These compositions can be used to prepare multi-layer superconductors using a wide variety of materials which can be used as the underlying layer on which the superconductor layer is formed.

The methods used to prepare the compositions can allow for improved control of the water content of the compositions. This can provide improved control over the conditions used to convert the compositions to superconductor materials and improved control over the properties of the superconductor materials that are formed. For example, improved control of the water content in the compositions can result in the formation of superconductor materials having a reduced density of cracks and/or blisters. Improved control of the water content in the compositions can also allow for a shorter period of time to prepare the superconductor materials.

In one aspect, the invention features a composition which includes a salt of a first metal, a salt of a second metal and a salt of a rare earth metal. At least one of the metal salts is a trifluoroacetate, and the composition has a total free acid concentration of less than about $1 \times 10^{-3}$ molar.

In another aspect, the invention features a composition which includes a salt of a first metal, a salt of a second metal and a salt of a rare earth metal. At least one of the metal salts is a trifluoroacetate, and the composition has a mole ratio of fluorine to the second metal of from about two to about 18.5.

The compositions can have a relatively low water content (e.g., less than about 50 volume percent).

The first, second and rare earth metals can be copper, barium and yttrium, respectively.

In a further aspect, the invention features a method which includes combining a first solution with a compound containing a trifluoroacetate group to form a second solution. The first solution includes a soluble compound of a first metal, a soluble compound of a second metal and a soluble compound of a rare earth metal.

In yet another aspect, the invention features a method which includes combining with a solvent a compound of a first metal, a compound of a second metal and a soluble of a rare earth metal to form a solution. Each of the compounds is soluble in the solvent. At least one of the soluble compounds is a trifluoroacetate salt.

In still another aspect, the invention features a multi-layer article which includes a first superconductor material layer and a second superconductor material layer disposed on the surface of the first superconductor material layer. The second superconductor material layer can be disposed on the surface of the first superconductor material layer using a solution phase technique (e.g., by using a metalorganic precursor).

The multi-layer article can further include a substrate or a buffer layer on which the first superconductor material layer is disposed.

The relative and/or absolute thicknesses of the first and second superconductor material layers can vary as desired. For example, the first superconductor material layer can be less than about one micron thick (e.g., less than about 0.5 micron thick, such as from about 0.05 micron thick to about 0.2 micron thick). As an example, the second superconductor material layer can be at least about one micron thick. As an example, the second superconductor material layer can also be less than about 10 microns thick (e.g., from about 4 microns to about 6 microns thick).

The combined thickness of the first and second superconductor material layers can be at least about one micron (e.g., at least about two microns, such as at least about three microns) while the critical current density of the superconductor layer in the multi-layer article can be at least about $5 \times 10^5$ Amperes per square centimeter (e.g., at least about $1 \times 10^6$ Amperes per square centimeter, such as at least about $2 \times 10^6$ Amperes per square centimeter).

The first superconductor material layer and/or the second superconductor material layer can be formed of a rare earth-barium-copper-oxide, such as yttrium-barium-copper-oxide.

The first superconductor material layer can be the same as the second superconductor material layer.

The multi-layer article can include a third superconductor material layer disposed on the surface of the second superconductor material layer. The absolute and/or relative thickness of the third superconductor material layer can vary as desired. For example, the third superconductor material layer can have a thickness of less than about 1 micron (e.g., less than about 0.5 micron, such as from about 0.05 micron to about 0.2 micron). Alternatively, the third superconductor layer can have a thickness of greater than about 0.5 micron).

Additional superconductor material layers having desired thicknesses can be further included in the multilayer article.

One potential advantage of the invention is that it can provide methods of preparing a multi-layer superconductor using a precursor solution and without substantially degrading the suitability of the surface of the underlying material layer (e.g., a substrate, a superconductor layer or a buffer layer) for epitaxial growth of the superconductor material layer. For example, in certain embodiments, the precursor solution can be used while undergoing substantially no reaction with the underlying material layer, without substantially altering the surface of the underlying material layer, and/or without introducing constituents from the underlying material layer (e.g., nickel atoms) into the superconductor material layer. This can result in a multi-layer superconductor that has one or more layers of superconductor material with a relatively high critical current density. In addition, this can allow for a broad range of materials to be used for the underlying layer.

Another potential advantage of the invention is that the compositions and methods allow for better control of the conditions used to form superconductor materials. This can result in higher quality superconductor materials and/or reduced process times.

A further potential advantage of the invention is that it can provide methods of preparing a multi-layer superconductor having one or more layers of superconductor material with a relatively high critical current density and a relatively large total thickness of superconductor material deposited by a low cost nonvacuum process.

Still another potential advantage of the invention is that the preparation and use of the compositions and methods can result in reduced effluent waste (e.g., reduced excess acid and/or reduced toxic waste) which can reduce the costs associated with the preparation and use of the compositions and methods.

Yet another potential advantage of the invention is that it can provide methods of making multi-layer superconductor articles having multiple layers of superconductor material that are relatively thick and have a relatively high critical current density.

An additional potential advantage of the invention is that the methods can involve the use of metalorganic solutions to form superconductor layers having relatively high critical current densities.

The invention can be particularly advantageous when preparing a superconductor in the form of an object having a relatively large surface area, such as a tape or a wafer.

In some embodiments, the superconductor material is preferably formed of YBCO (e.g., $YBa_2Cu_3O_{7-x}$).

Unless otherwise defined, all technical and scientific terms used herein have the same meaning as commonly understood by one of ordinary skill in the art to which this invention belongs. Although methods and materials similar or equivalent to those described herein can be used in the practice of the invention, suitable methods and materials are described below.

In case of conflict, the present specification, including definitions, will control. In addition, the materials, methods, and examples are illustrative only and not intended to be limiting.

Other features and advantages of the invention will be apparent from the description of the preferred embodiments, the figures and the claims.

DESCRIPTION OF THE PREFERRED EMBODIMENTS

The invention relates to superconductor articles, and compositions (e.g., precursor solutions) and methods of making superconductor articles. Generally, the compositions include one or more solvents, a salt of a first metal, a salt of a second metal and a salt of a third metal. At least one of the metal salts is a trifluoroacetate. Optionally, the compositions can also include water.

The compositions can have a relatively low total free acid concentration. Preferably, the compositions have a total free acid concentration of less than about $1 \times 10^{-3}$ molar, more preferably less than about $1 \times 10^{-5}$ molar, and most preferably about $1 \times 10^{-7}$ molar. Examples of free acids that can be contained in the compositions include trifluoroacetic acid, acetic acid, nitric acid, sulfuric acids, acids of iodides, acids of bromides and acids of sulfates.

In some embodiments, such as when the compositions contain water, the compositions can have a relatively neutral pH. In these embodiments, the pH of the compositions is preferably at least about 3, more preferably at least about 5, and most preferably about 7.

The compositions can have a relatively low water content. Preferably, the compositions have a water content of less than 50 volume percent, more preferably less than about 35 volume percent, and most preferably less than 25 volume percent.

Typically, the first metal contained in the compositions is copper, and the salt of the first metal can be copper trifluoroacetate (e.g., copper(II) trifluoroacetate).

The second metal contained in the compositions can be barium, strontium or calcium, and the salt of the second metal can be the trifluoroacetate salt of the second metal. Preferably, the second metal is barium, and the salt of the second metal can be barium trifluoroacetate.

The rare earth metal contained in the compositions can be yttrium, lanthanum, europium, gadolinium, terbium, dysprosium, holmium, erbium, thulium, ytterbium, cerium, praseodymium, neodymium, promethium, samarium or lutetium. The salt of the rare earth metal can be the trifluoroacetate salt of the rare earth metal. Preferably, the rare earth metal is yttrium, and the salt of the rare earth metal can be yttrium trifluoroacetate.

The amount of the first, second and rare earth metals can be selected so that the ratio of the molar amount of each of these elements (e.g, in the ionic state) in the precursor solution is about 3:2:1.

The total amount of trifluoroacetate can be selected so that the mole ratio of fluorine contained in the composition (e.g., in the form of trifluoroacetate) to the second metal (e.g, barium ions) contained in the composition is at least about 2:1 (e.g., from about 2:1 to about 18.5:1, or from about 2:1 to about 10:1).

In general, the compositions can be prepared by combining soluble compounds of the first metal, the second metal and the rare earth metal with the desired solvent(s) and optionally water. As used herein, "soluble compounds" of the first, second and rare earth metals refer to compounds of these metals that are capable of dissolving in the solvent(s) contained in the compositions. Such compounds include, for example, salts, oxides and hydroxides of these metals.

In certain embodiments, the compositions can be prepared by combining in one or more solvents the trifluoroacetate salt of the first metal with the trifluoroacetate salt of the second metal and the trifluoroacetate salt of the rare earth metal in a mole ratio of about 3:2:1. The water content of the composition can be determined by the amount of hydrate in the initial salts or by adding an amount of water sufficient to achieve a desired water content.

In some embodiments, the compositions can be prepared by combining in one or more solvents: the trifluoroacetate salt of one of the first, second or rare earth metal with salts of the other metals; the trifluoroacetate salt of two of the first, second and rare earth metal with the salt of the other metal; or the trifluoroacetate salt of each of the first, second and rare earth metals. The metal salts can be any salts that are capable of dissolving in the selected solvent(s). Such metal salts include, for example, nitrates, acetates, hydroxides, alkoxides, iodides and sulfates.

In alternate embodiments, preparing the compositions can include combining the hydroxides, oxides or salts of the first metal, the second metal and the third metal (e.g., the acetate salts of the first, second and rare earth metal) in a mole ratio of the metal cations of about 3:2:1 with a stoichiometric solution of trifluoroacetic acid to form the trifluoroacetate salts of the first, second and rare earth metals. This solution can be dried (e.g., by using vacuum and/or heat) to form a composition having a relatively small concentration of total free acid (e.g., trifluoroacetic acid).

In other embodiments, preparation of the compositions can include combining salts (e.g., the acetates) of the first, second and rare earth metal with an aqueous solution of trifluoroacetic acid to form the trifluoroacetates of the first, second and rare earth metals. The solution can then be dried (e.g., by using vacuum and/or heat) to form a mixture having a relatively low concentration of total free acid (e.g., trifluoroacetic acid and/or acetic acid). One or more solvents can then be added to the mixture to provide the composition.

Combinations of the foregoing methods of preparing the compositions can also be used.

Generally, the particular solvent(s) used, as well as the amount of the solvent(s) and/or water contained in the compositions can be selected based upon the technique that will be used to dispose the composition on the surface of the underlying layer (e.g., buffer layer, superconductor layer or substrate). For example, if the solution will be dip coated, spin coated or web coated onto the surface of the underlying material layer, one or more alcohols (e.g., methanol, 2-methoxyethanol, butanol and/or isopropanol) can be used, and the amount of solvent(s) can be selected so that the desired viscosity and solids content is achieved. In embodiments in which the composition is to be web coated on the underlying layer, it may be desirable for the composition to have a kinematic viscosity of from about one centiStoke to about 10 centiStokes.

Subsequent to being disposed on the surface of the underlying layer, the solution is treated to form a layer of superconductor material. This treatment generally involves heating at appropriate rates and in an appropriate gas environment to form an intermediate (e.g., a metal oxyfluoride intermediate). This intermediate is then further heated to form the desired superconductor material. Certain methods of forming the intermediate and the superconductor material are described below.

Figure 1:
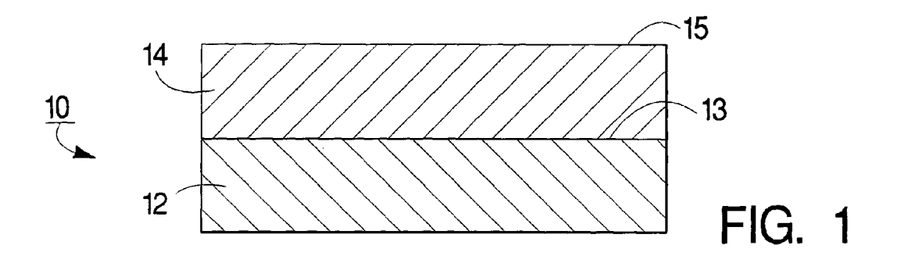
FIG. 1 is a cross-sectional view of one embodiment of a multi-layer article.

FIG. 1 shows a multi-layer superconductor 10 according to one embodiment of the invention and prepared using the above-described methods. Article 10 includes a substrate layer 12 with a surface 13 and a superconductor material layer 14 with a surface 15. Layer 14 is disposed on surface 13.

Layer 12 can be formed of any material capable of supporting layer 14. In embodiments in which article 10 is a multi-layer superconductor, layer 12 can be formed of a substrate material. Examples of substrate materials that can be used as layer 12 include for example, metals and/or alloys, such as nickel, silver, copper, zinc, aluminum, iron, chromium, vanadium, palladium, molybdenum and/or their alloys.

Surface 13 of layer 12 can also be prepared using vacuum processes, such as ion beam assisted deposition, inclined substrate deposition and other vacuum techniques known in the art to form a biaxially textured surface on, for example, a randomly oriented polycrystalline surface.

In some embodiments, a buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 400° C. (e.g., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

These methods are described in PCT Publication No. WO 99/25908, published on May 27, 1999, and entitled "Thin Films Having A Rock-Salt-Like Structure Deposited on Amorphous Surfaces," which is hereby incorporated by reference.

In other embodiments, the substrate can be formed of alloys having one or more surfaces that are biaxially textured (e.g., (113)[211]) or cube textured (e.g., (100)[001] or (100)[011]). The alloys can have a relatively low Curie temperature (e.g., at most about 80K, at most about 40K, or at most about 20K).

In some of these embodiments, the substrate is a binary alloy that contains two of the following metals: copper, nickel, chromium, vanadium, aluminum, silver, iron, palladium, molybdenum, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In these embodiments the alloy can contain one or more oxide formers (e.g., Mg, Al, Ti, Cr, Ga, Ge, Zr, Hf, Y, Si, Pr, Eu, Gd, Tb, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. The alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

These methods are described in commonly owned U.S. patent application Ser. No. 09/283,775, filed Mar. 31, 1999, and entitled "Alloy Materials;" commonly owned U.S. patent application Ser. No. 09/283,777, filed Mar. 31, 1999, and entitled "Alloy Materials;" PCT Publication No. WO 99/17307, published on Apr. 8, 1999, and entitled "Substrates with Improved Oxidation Resistance;" and PCT Publication No. WO 99/16941, published on Apr. 8, 1999, and entitled "Substrates for Superconductors," all of which are hereby incorporated by reference.

In some embodiments, stable oxide formation can be mitigated until a first epitaxial (for example, buffer) layer is formed on the biaxially textured alloy surface, using an intermediate layer disposed on the surface of the substrate. Intermediate layers suitable for use in the present invention include those epitaxial metal or alloy layers that do not form surface oxides when exposed to conditions as established by $P_{O2}$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In preferred embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, substrate 12 can be in the form of an object having a relatively large surface area (e.g., a tape or a wafer). In these embodiments, substrate 12 is preferably formed of a relatively flexible material (e.g., deformation textured nickel or a deformation textured nickel alloy).

Preferably, surface 13 of layer 12 has a relatively well defined crystallographic orientation. For example, surface 13 can be a biaxially textured surface (e.g., a (113)[211] surface) or a cube textured surface (e.g., a (100)[011] surface or a (100)[001] surface). Preferably, the peaks in an X-ray diffraction pole figure of surface 13 have a FWHM of less than about 20° (e.g., less than about 15°, less than about 10°, or from about 5° to about 10°).

Layer 14 can be prepared using one or more of a variety of techniques.

Generally, layer 14 is prepared using a precursor solution. The precursor solution is applied to a surface (e.g., a buffer layer surface), such as by spin coating or other techniques known to those skilled in the art, and subsequently heated.

In certain of these embodiments, the solution is heated at a rate of from about 0.5° C. per minute to about 10° C. per minute in moist oxygen (e.g., having a dew point in the range of from about 20° C. to about 75° C.) to a temperature in the range of from about 300° C. to about 500° C. The coating is then heated for about one hour to a temperature of less than about 860° C. (e.g., less than about 810° C.) in a moist reducing nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating is subsequently heated to a temperature of from about 400° C. to about 500° C. for at least about eight hours at in dry oxygen. The coating can then be cooled to room temperature in static dry oxygen.

These methods are described in U.S. Pat. No. 5,231,074, issued on Jul. 27, 1993, and entitled "Preparation of Highly Textured Oxide Superconducting Films from MOD Precursor Solutions," which is hereby incorporated by reference.

In alternate embodiments, the precursor solution is heated from an initial temperature (e.g., room temperature) to a temperature of from about 190° C. to about 215° C. (e.g., about 210° C.) at a rate of at least about 5° C. per minute (e.g., at least about 8° C. per minute, or at least about 10° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

In these embodiments, heating is then continued to a temperature of from about 220° C. to about 290° C. (e.g., about 220° C.) at a rate of from about 0.05° C. per minute to about 0.4° C. per minute (e.g., from about 0.1° C. per minute to about 0.4° C. per minute) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr.

This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form an intermediate of the superconductor material (e.g., a metal oxyfluoride intermediate). The nominal partial pressure of oxygen can be, for example, from about 0.1 Torr to about 760 Torr.

These methods are described in commonly owned U.S. Provisional Patent Application Ser. No. 60/166,145, filed on Nov. 18, 1999, and entitled "Methods and Compositions for Making a Multi-Layer Article," and commonly owned U.S. patent application Ser. No. 09/615,991, filed on even date herewith, and entitled "Methods and Compositions for Making a Multi-layer Article," both of which are hereby incorporated by reference.

In other embodiments, heating the precursor solution includes one or more steps in which the temperature is held substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours) after a first temperature ramp to a temperature greater than about room temperature (e.g., at least about 50° C., at least about 100° C., at least about 200° C., at least about 215° C., from about 215° C. to about 225° C., about 220° C.).

In these embodiments, heating the precursor solution can involve using more than one gas environment (e.g., a gas environment having a relatively high water vapor pressure and a gas environment having a relatively low water vapor pressure) while maintaining the temperature substantially constant (e.g., constant within about 10° C., within about 5° C., within about 2° C., within about 1° C.) for a relatively long period of time (e.g., more than about one minute, more than about five minutes, more than about 30 minutes, more than about an hour, more than about two hours, more than about four hours). As an example, in a high water vapor pressure environment, the water vapor pressure can be from about 5 Torr to about 40 Torr (e.g., from about 25 Torr to about 38 Torr, such as about 32 Torr). A low water vapor pressure environment can have a water vapor pressure of less than about 1 Torr (e.g., less than about 0.1 Torr, less than about 10 milliTorr, about five milliTorr).

Generally, in these embodiments, the precursor solution is heated from about room temperature to from about 215° C. to about 225° C. using a temperature ramp of 10° C. per minute or less. During this step, the partial pressure of water vapor in the nominal gas environment is preferably maintained at from about 5 Torr to about 40 Torr. The partial pressure of oxygen in the nominal gas environment can be maintained at from about 0.1 Torr to about 760 Torr. The temperature and nominal gas environment are then held substantially constant for a relatively long period of time (e.g., at least about one minute).

After this time period, the gas environment is changed to a relatively dry gas environment (e.g., less than about one Torr water vapor, less than about 0.1 Torr water vapor, less than about 10 milliTorr water vapor, five milliTorr water vapor) while maintaining the temperature substantially constant. The temperature and nominal gas environment are then held substantially constant for a relatively long period of time.

After this time period, the nominal gas environment is maintained substantially constant and heating is continued to a temperature sufficient to form the metal oxyfluoride intermediate (e.g., about 400° C.). This step is preferably performed using a temperature ramp of 10° C. per minute or less.

These methods are described in commonly owned U.S. patent application Ser. No. 09/616,811, filed on even date herewith, and entitled "Methods of Making A Superconductor," which is hereby incorporated by reference.

The foregoing treatments of a precursor solution can result in a metal oxyfluoride intermediate. Preferably, the metal oxyfluoride intermediate has a relatively low defect density. The metal oxyfluoride intermediate can be further heated to form the desired superconductor layer. Typically, this step is performed by heating to a temperature of from about 700° C. to about 825° C. During this step, the nominal gas environment typically can contain from about 0.1 Torr to about 50 Torr oxygen and from about 0.1 Torr to about 150 Torr (e.g., about 12 Torr) of water vapor with the balance being nitrogen and/or argon.

Alternatively, the coating is then heated for about one hour to a temperature of less than about 860° C. (e.g., less than about 810° C.) in a moist reducing nitrogen-oxygen gas mixture (e.g., having a composition including from about 0.5% to about 5% oxygen). Optionally, the coating can be further heated to a temperature of from about 860° C. to about 950° C. for from about five to about 25 minutes. The coating is subsequently heated to a temperature of from about 400° C. to about 500° C. for at least about eight hours at in dry oxygen. The coating can then be cooled to room temperature in static dry oxygen. This approach is described in U.S. Pat. No. 5,231,074.

In other embodiments, the metal oxyfluoride is converted into an oxide superconductor at a rate of conversion selected by adjusting temperature, vapor pressure of gaseous water or both. For example, the metal oxyfluoride can be converted in a processing gas having a moisture content of less than 100% relative humidity (e.g., less than about 95% relative humidity, less than about 50% relative humidity, or less than about 3% relative humidity) at 25° C. to form some oxide superconductor, then completing the conversion using a processing gas having a higher moisture content (e.g., from about 95% relative humidity to about 100% relative humidity at 25° C.). The temperature for converting the metal oxyfluoride can be in the range of from about 700° C. to about 900° C. (e.g., from about 700° C. to about 835° C.). The processing gas preferably contains from about 1 volume percent oxygen gas to about 10 volume percent oxygen gas.

These methods are described in PCT Publication No. WO 98/58415, published on Dec. 23, 1998, and entitled "Controlled Conversion of Metal Oxyfluorides into Superconducting Oxides," which is hereby incorporated by reference.

In particular embodiments, methods of treating the solution can be employed to minimize the formation of undesirable a-axis oriented oxide layer grains, by inhibiting the formation of the oxide layer until the required reaction conditions are attained.

Conventional processes developed for decomposition and reaction of fluoride-containing precursors use a constant, and low, non-turbulent flow of process gas that is introduced into the decomposition furnace in an orientation that is parallel to the film surface, resulting in a stable boundary layer at the film/gas interface. In the apparatus types typically used for oxide layer precursor decomposition and reaction, the diffusion of gaseous reactants and products through this gas/film boundary layer appears to control the overall reaction rates. In thin, small area films (for example, less than about 0.4 microns thick and less than about a square centimeter), the diffusion of $H_2O$ into the film and the diffusion of HF out of the film occur at rates such that the formation of the $YBa_2Cu_3O_{7-x}$ phase does not begin at any significant rate until the sample reaches the processing temperature. However, as the film thickness or area increases, the rates of gaseous diffusion into and out of the film decrease, all other parameters being equal. This results in longer reaction times and/or incomplete formation of the $YBa_2Cu_3O_{7-x}$ phase, resulting in reduced crystallographic texture, lower density, and reduced critical current density. Thus, the overall rate of $YBa_2Cu_3O_{7-x}$ phase formation is determined, to a significant extent, by the diffusion of gases through the boundary layer at the film surface.

One approach to eliminating these boundary layers is to produce a turbulent flow at the film surface. Under such conditions, the local gas composition at the interface is maintained essentially the same as in the bulk gas (that is, the $pH_2O$ is constant, and the pHF is approximately zero). Thus, the concentration of the gaseous products/reactants in the film is not controlled by the diffusion through the gas/film surface boundary layer condition, but rather by diffusion through the film. In order to minimize the nucleation of a-axis $YBa_2Cu_3O_{7-x}$ oriented grains on a substrate surface, the formation of the $YBa_2Cu_3O_{7-x}$ phase is inhibited until desired process conditions are reached. For example, the formation of the $YBa_2Cu_3O_{7-x}$ phase can be inhibited until desired process temperature is reached.

In one embodiment, a combination of: 1) low (non-turbulent) process gas flow, so that a stable boundary layer is established at the film/gas interface, during the ramp to temperature, and 2) high (turbulent) process gas flow, so that the boundary layer is disrupted at the film/gas interface, is employed. For example, in a three inch tube furnace, the flow can be from about 0.5 to about 2.0 L/min during the temperature ramp from ambient temperature to the desired process temperature. Thereafter, the flow can be increased to a value of from about 4 to about 15 L/min during the time at which the film is being processed. Thus, the rate of formation of $YBa_2Cu_3O_{7-x}$ and epitaxial texture formation can be increased at high temperature, while minimizing the amount of unwanted a-axis nucleation and growth at low temperature during ramp up. According to these processes, a-axis nucleated grains are desirably present in an amount of less than about 1%, as determined by scanning electron microscopy.

More details are provided in commonly owned U.S. patent application Ser. No. 09/616,566, filed on even date herewith, and entitled "Control of Oxide Layer Reaction Rates," which is hereby incorporated by reference.

In preferred embodiments, layer 14 has a relatively high critical current density (e.g., at least about $5 \times 10^5$ Amperes per square centimeter). Preferably, layer 14 has a critical current density of at least about $5 \times 10^{-5}$ Amperes per square centimeter, more preferably at least about $1 \times 16$ Amperes per square centimeter, and most preferably at least about $2 \times 10^6$ Amperes per square centimeter, as determined by transport measurement at 77K in self field (i.e., no applied field) using a 1 micro Volt per centimeter criterion.

In preferred embodiments, layer 14 is well-ordered (e.g., biaxially textured or cube textured).

The thickness of layer 14 can vary depending upon the intended purpose of article 10. In some embodiments, layer 14 preferably has a thickness of from about 1 micron to about 10 microns (e.g., from about 3 microns to about 8 microns, such as from about 4 microns to about 6 microns).

Figure 2:
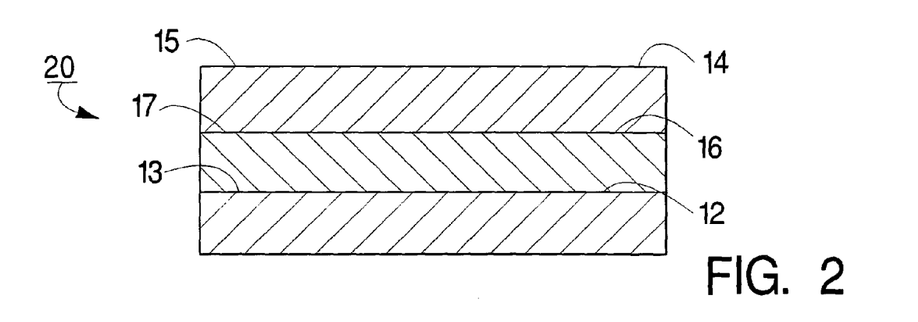
FIG. 2 is a cross-sectional view of another embodiment of a multi-layer article.

FIG. 2 shows an embodiment of an article 20 that can be formed by the methods of the invention. Article 20 includes layers 12 and 14. Article 20 also includes a layer 16 disposed between layers 12 and 14 such that layer 16 is disposed on surface 13 and layer 14 is disposed on a surface 17 of layer 16.

Layer 16 can be formed of any material capable of supporting layer 14. For example, layer 16 can be formed of one or more layers of buffer layer material. Examples of buffer layer materials include metals and metal oxides, such as silver, nickel, $TbO_x$, $GaO_x$, $CeO_2$, yttria-stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, $NdA_{103}$ and/or some nitrides as known to those skilled in the art. A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527.

In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors), in which the level of carbon contamination can be greatly reduced over other known processes using metal alkoxide precursors.

If the substrate underlying an oxide layer is insufficiently covered by a precursor solution used to make the oxide layer, then the oxide layer will not provide the desired protection of the substrate from oxidation during deposition of the subsquent oxide layers when carried out in an oxidizing atmosphere relative to the substrate and will not provide a complete template for the epitaxial growth of subsequent layers. By heating a sol gel precursor film, and thereby allowing the precursor to flow into the substrate grain boundary areas, complete coverage can result. The heating can be relatively low temperature, for example, from about 80° C. to about 320° C., for example, from about 100° C. to about 300° C., or from about 100° C. to about 200° C. Such temperatures can be maintained from about 1 to about 60 minutes, for example, from about 2 to about 45 minutes, or from about 15 to about 45 minutes. The heating step can also be carried out using higher temperatures for a shorter time, for example, a film can be processed within two minutes at a temperature of 300° C.

This heating step can be carried out after, or concurrently with, the drying of excess solvent from the sol gel precursor film. It must be carried out prior to decomposition of the precursor film, however.

The carbon contamination accompanying conventional oxide film preparation in a reducing environment (e.g., 4% $H_2$—Ar) is believed to be the result of an incomplete removal of the organic components of the precursor film. The presence of carbon-containing contaminants $C_yH_y$ and $C_aH_bO_c$ in or near the oxide layer can be detrimental, since they can alter the epitaxial deposition of subsequent oxide layers. Additionally, it is likely that the trapped carbon-containing contaminants buried in the film can be oxidized during the processing steps for subsequent oxide layers, which can utilize oxidizing atmospheres. The oxidation of the carbon-containing contaminants can result in $CO_2$ formation, and the subsequent blistering of the film, and possible delamination of the film, or other defects in the composite structure. Thus, it is undesirable to allow carbon-containing contaminants arising from metal alkoxide decomposition to become oxidized only after the oxide layer is formed. Preferably, the carbon-containing contaminants are oxidized (and hence removed from the film structure as $CO_2$) as the decomposition occurs. Also the presence of carbon-containing species on or near film surfaces can inhibit the epitaxial growth of subsequent oxide layers.

According to particular embodiments, after coating a metal substrate or buffer layer, the precursor solution can be air dried, and then heated in an initial decomposition step. Alternatively, the precursor solution can be directly heated in an initial decomposition step, under an atmosphere that is reducing relative to the metal substrate. Once the oxide layer initially nucleates on the metal substrate in the desired epitaxial orientation, the oxygen level of the process gas is increased, for example, by adding water vapor or oxygen. The nucleation step requires from about 5 minutes to about 30 minutes to take place under typical conditions.

These methods are described in U.S. patent application Ser. No. 09/617,520, filed on even date herewith, and entitled "Enhanced Purity Oxide Layer Formation," which is hereby incorporated by reference.

In certain embodiments, an epitaxial buffer layer can be formed using a low vacuum vapor deposition process (e.g., a process performed at a pressure of at least about $1 \times 10^{-3}$ Torr). The process can include forming the epitaxial layer using a relatively high velocity and/or focused gas beam of buffer layer material.

The buffer layer material in the gas beam can have a velocity of greater than about one meter per second (e.g., greater than about 10 meters per second or greater than about 100 meters per second). At least about 50% of the buffer layer material in the beam can be incident on the target surface (e.g., at least about 75% of the buffer layer material in the beam can be incident on the target surface, or at least about 90% of the buffer layer material in the beam can be incident on the target surface).

The method can include placing a target surface (e.g., a substrate surface or a buffer layer surface) in a low vacuum environment, and heating the target surface to a temperature which is greater than the threshold temperature for forming an epitaxial layer of the desired material on the target surface in a high vacuum environment (e.g., less than about $1 \times 10^{-3}$ Torr, such as less than about $1 \times 10^{-4}$ Torr) under otherwise identical conditions. A gas beam containing the buffer layer material and optionally an inert carrier gas is directed at the target surface at a velocity of at least about one meter per second. A conditioning gas is provided in the low vacuum environment. The conditioning gas can be contained in the gas beam, or the conditioning gas can be introduced into the low vacuum environment in a different manner (e.g., leaked into the environment). The conditioning gas can react with species (e.g., contaminants) present at the target surface to remove the species, which can promote the nucleation of the epitaxial buffer layer.

The epitaxial buffer layer can be grown on a target surface using a low vacuum (e.g., at least about $1 \times 10^{-3}$ Torr, at least about 0.1 Torr, or at least about 1 Torr) at a surface temperature below the temperature used to grow the epitaxial layer using physical vapor deposition at a high vacuum (e.g., at most about $1 \times 10^{-4}$ Torr). The temperature of the target surface can be, for example, from about 25° C. to about 800° C. (e.g., from about 500° C. to about 800° C., or from about 500° C. to about 650° C.).

The epitaxial layer can be grown at a relatively fast rate, such as, for example, at least about 50 Angstroms per second.

These methods are described in U.S. Pat. No. 6,027,564, issued Feb. 22, 2000, and entitled "Low Vacuum Process for Producing Epitaxial Layers;" U.S. Pat. No. 6,022,832, issued Feb. 8, 2000, and entitled "Low Vacuum Process for Producing Superconductor Articles with Epitaxial Layers;" and/or commonly owned U.S. patent application Ser. No. 09/007,372, filed Jan. 15, 1998, and entitled "Low Vacuum Process for Producing Epitaxial Layers of Semiconductor Material," all of which are hereby incorporated by reference.

In alternate embodiments, an epitaxial buffer layer can be deposited by sputtering from a metal or metal oxide target at a high throughput. Heating of the substrate can be accomplished by resistive heating or bias and electric potential to obtain an epitaxial morphology. A deposition dwell may be used to form an oxide epitaxial film from a metal or metal oxide target.

The oxide layer typically present on substrates can be removed by exposure of the substrate surface to energetic ions within a reducing environment, also known as Ion Beam etching. Ion Beam etching can be used to clean the substrate prior to film deposition, by removing residual oxide or impurities from the substrate, and producing an essentially oxide-free preferably biaxially textured substrate surface. This improves the contact between the substrate and subsequently deposited material. Energetic ions can be produced by various ion guns, for example, which accelerate ions such as $Ar^+$ toward a substrate surface. Preferably, gridded ion sources with beam voltages greater than 150 ev are utilized. Alternatively, a plasma can be established in a region near the substrate surface. Within this region, ions chemically interact with a substrate surface to remove material from that surface, including metal oxides, to produce substantially oxide-free metal surface.

Another method to remove oxide layers from a substrate is to electrically bias the substrate. If the substrate tape or wire is made negative with respect to the anode potential, it will be subjected to a steady bombardment by ions from the gas prior to the deposition (if the target is shuttered) or during the entire film deposition. This ion bombardment can clean the wire or tape surface of absorbed gases that might otherwise be incorporated in the film and also heat the substrate to elevated deposition temperatures. Such ion bombardment can be further advantageous by improving the density or smoothness of the epitaxial film.

Upon formation of an appropriately textured, substantially oxide-free substrate surface, deposition of a buffer layer can begin. One or more buffer layers, each including a single metal or oxide layer, can be used. In some preferred embodiments, the substrate is allowed to pass through an apparatus adapted to carry out steps of the deposition method of these embodiments. For example, if the substrate is in the form of a wire or tape, the substrate can be passed linearly from a payout reel to a take-up reel, and steps can be performed on the substrate as it passes between the reels.

According to some embodiments, substrate materials are heated to elevated temperatures which are less than about 90% of the melting point of the substrate material but greater than the threshold temperature for forming an epitaxial layer of the desired material on the substrate material in a vacuum environment at the predetermined deposition rate. In order to form the appropriate buffer layer crystal structure and buffer layer smoothness, high substrate temperatures are generally preferred. Typical lower limit temperatures for the growth of oxide layers on metal are approximately 200°C to 800°C, preferably 500°C to 800°C, and more preferably, 650°C to 800°C. Various well-known methods such as radiative heating, convection heating, and conduction heating are suitable for short (2 cm to 10 cm) lengths of substrate, but for longer (1m to 100 m) lengths, these techniques may not be well suited. Also to obtain desired high throughput rates in a manufacturing process, the substrate wire or tape must be moving or transferring between deposition stations during the process. According to particular embodiments, the substrates are heated by resistive heating, that is, by passing a current through the metal substrate, which is easily scaleable to long length manufacturing processes. This approach works well while instantaneously allowing for rapid travel between these zones. Temperature control can be accomplished by using optical pyrometers and closed loop feedback systems to control the power supplied to the substrate being heated. Current can be supplied to the substrate by electrodes which contact the substrate in at least two different segments of the substrate. For example, if the substrate, in the form of a tape or wire, is passed between reels, the reels themselves could act as electrodes. Alternatively, if guides are employed to transfer the substrate between reels, the guides could act as electrodes. The electrodes could also be completely independent of any guides or reels as well. In some preferred embodiments, current is applied to the tape between current wheels.

In order that the deposition is carried out on tape that is at the appropriate temperature, the metal or oxide material that is deposited onto the tape is desirably deposited in a region between the current wheels. Because the current wheels can be efficient heat sinks and can thus cool the tape in regions proximate to the wheels, material is desirably not deposited in regions proximate to the wheels. In the case of sputtering, the charged material deposited onto the tape is desirably not influenced by other charged surfaces or materials proximate to the sputter flux path. For this reason, the sputter chamber is preferably configured to place components and surfaces which could influence or deflect the sputter flux, including chamber walls, and other deposition elements, in locations distant from the deposition zone so that they do not alter the desired linear flux path and deposition of metal or metal oxide in regions of the tape at the proper deposition temperature.

More details are provided in commonly owned U.S. patent application Ser. No. 09/500,701, filed on Feb. 9, 2000, and entitled "Oxide Layer Method," and commonly owned U.S. patent application Ser. No. 09/615,669, filed on even date herewith, and entitled "Oxide Layer Method," both of which are hereby incorporated by reference in their entirety.

In certain embodiments, layer 16 can be conditioned (e.g., thermally conditioned and/or chemically conditioned) so that layer 14 is formed on a conditioned surface. The conditioned surface of the layer 16 can be biaxially textured (e.g., (113)[211]) or cube textured (e.g., (100)[011] or (100)[011]), have peaks in an X-ray diffraction pole figure that have a full width at half maximum of less than about 20° (e.g., less than about 15°, less than about 10°, or from about 5° to about 10°), be smoother than before conditioning as determined by high resolution scanning electron microscopy or atomic force microscopy, have a relatively high density, have a relatively low density of impurities, exhibit enhanced adhesion to other material layers (e.g., a superconductor layer or a buffer layer) and/or exhibit a relatively small rocking curve width as measured by x-ray diffraction.

"Chemical conditioning" as used herein refers to a process which uses one or more chemical species (e.g., gas phase chemical species and/or solution phase chemical species) to affect changes in the surface of a material layer, such as a buffer layer or a superconductor material layer, so that the resulting surface exhibits one or more of the above noted properties.

"Thermal conditioning" as used herein refers to a process which uses elevated temperature, with or without chemical conditioning, to affect changes in the surface of a material layer, such as a buffer layer or a superconductor material layer, so that the resulting surface exhibits one or more of the above noted properties. Thermal conditioning can be performed with or without the use of chemical conditioning. Preferably, thermal conditioning occurs in a controlled environment (e.g., controlled gas pressure, controlled gas environment and/or controlled temperature).

Thermal conditioning can include heating the surface of the layer 16 to a temperature at least about 5° C. above the deposition temperature or the crystallization temperature of the underlying layer (e.g., from about 15° C. to about 500° C. above the deposition temperature or the crystallization temperature of the underlying layer, from about 75° C. to about 300° C. above the deposition temperature or the crystallization temperature of the underlying layer, or from about 150° C. to about 300° C. above the deposition temperature or the crystallization temperature of the underlying layer). Examples of such temperatures are from about 500° C. to about 1200° C. (e.g., from about 800° C. to about 1050° C.). Thermal conditioning can be performed under a variety of pressure conditions, such as above atmospheric pressure, below atmospheric pressure, or at atmospheric pressure. Thermal conditioning can also be performed using a variety of gas environments, such as a chemical conditioning environment (e.g., an oxidizing gas environment, a reducing gas environment) or an inert gas environment.

"Deposition temperature" as used herein refers to the temperature at which the layer being conditioned was deposited.

"Crystallization temperature" as used herein refers to the temperature at which a layer of material (e.g., the underlying layer) takes on a crystalline form.

Chemical conditioning can include vacuum techniques (e.g., reactive ion etching, plasma etching and/or etching with fluorine compounds, such as $BF_3$ and/or $CF_4$). Chemical conditioning techniques are disclosed, for example, in *Silicon Processing for the VLSI Era*, Vol. 1, eds. S. Wolf and R. N. Tanber, pp. 539–574, Lattice Press, Sunset Park, Calif., 1986.

Alternatively or additionally, chemical conditioning can involve solution phase techniques, such as disclosed in *Metallurgy and Metallurgical Engineering Series*, 3d ed., George L. Kehl, McGraw-Hill, 1949. Such techniques can include contacting the surface of the underlying layer with a relatively mild acid solution (e.g., an acid solution containing less about 10 percent acid, less than about two percent acid, or less than about one percent acid). Examples of mild acid solutions include perchloric acid, nitric acid, hydrofluoric acid, hydrochloric acid, acetic acid and buffered acid solutions. In one embodiment, the mild acid solution is about one percent aqueous nitric acid. In certain embodiments, bromide-containing and/or bromine-containing compositions (e.g., a liquid bromine solution) can be used to condition the surface of a buffer layer or a superconductor layer.

These methods are described in commonly owned U.S. Provisional Patent Application No. 60/166,140, filed Nov. 18, 1999, and entitled "Multi-Layer Articles and Methods of Making Same," and commonly owned U.S. patent application Ser. No. 09/615,999, filed on even date herewith, and entitled "Multi-layer Articles and Methods of Making Same," both of which are hereby incorporated by reference.

Alternatively, layer 16 can be formed of a superconductor material, which can be prepared as described above. In embodiments in which layer 16 is formed of a superconductor material, the relative thickness of layers 16 and 14 can vary depending upon the method used to prepare article 20 and/or the intended use of article 20. For example, layer 14 can be thicker than layer 16, or layer 16 can be thicker than layer 14. Preferably, layer 16 has a thickness of less than about one micron (e.g., less than about 0.5 micron, such as from about 0.05 micron to about 0.2 micron), and layer 14 has a thickness of greater than about one micron (e.g., greater than about two microns, such as greater than about three microns or greater than about four microns).

In embodiments in which layer 16 is formed of a superconductor material, the combined thickness of layers 14 and 16 can vary depending upon the methods used to prepare article 20 and/or the intended use of article 20. For example, the combined thickness of layers 14 and 16 can be less than one micron or greater than one micron. Preferably, the combined thickness of layers 14 and 16 is greater than about one micron (e.g., greater than about two microns, such as greater than about three microns or greater than about four microns).

In embodiments in which layer 16 is formed of a superconductor material, the surface of layer 16 can be chemically and/or thermally conditioned as described above.

In certain embodiments, where layer 16 is formed of a superconductor material, layer 14 can be from solid-state, or semi solid state, precursor materials deposited in the form of a dispersion. These precursor compositions allow for example the substantial elimination of $BaCO_3$ formation in final YBCO superconducting layers, while also allowing control of film nucleation and growth.

Two general approaches are presented for the formulation of precursor compositions. In one approach, the cationic constituents of the precursor composition are provided in components taking on a solid form, either as elements, or preferably, compounded with other elements. The precursor composition is provided in the form of ultrafine particles which are dispersed so that they can be coated onto and adhere onto the surface of a suitable substrate, intermediate-coated substrate, or buffer-coated substrate. These ultrafine particles can be created by aerosol spray, by evaporation or by similar techniques which can be controlled to provide the chemical compositions and sizes desired. The ultrafine particles are less than about 500 nm, preferably less than about 250 nm, more preferably less than about 100 nm and even more preferably less than about 50 nm. In general, the particles are less than about 50% the thickness of the desired final film thickness, preferably less than about 30% most preferably less than about 10% of the thickness of the desired final film thickness. For example, the precursor composition can comprise ultrafine particles of one or more of the constituents of the superconducting layer in a substantially stoichiometric mixture, present in a carrier. This carrier comprises a solvent, a plasticizer, a binder, a dispersant, or a similar system known in the art, to form a dispersion of such particles. Each ultrafine particle can contain a substantially compositionally uniform, homogeneous mixture of such constituents. For example, each particle can contain $BaF_2$, and rare-earth oxide, and copper oxide or rare earth/barium/copper oxyfluoride in a substantially stoichiometric mixture. Analysis of such particles would desirably reveal a rare-earth:barium:copper ratio as substantially 1:2:3 in stoichiometry, with a fluorine:barium ratio of substantially 2:1 in stoichiometry. These particles can be either crystalline, or amorphous in form.

In a second approach, the precursor components can be prepared from elemental sources, or from a substantially stoichiometric compound comprising the desired constituents. For example, evaporation of a solid comprising a substantially stoichiometric compound of desired REBCO constituents (for example, $YBa_2Cu_3O_{7-x}$) or a number of solids, each containing a particular constituent of the desired final superconducting layer (for example, $Y_2O_3$, $BaF_2$, CuO) could be used to produce the ultrafine particles for production of the precursor compositions. Alternatively, spray drying or aerosolization of a metalorganic solution comprising a substantially stoichiometric mixture of desired REBCO constituents could be used to produce the ultrafine particles used in the precursor compositions. Alternatively, one or more of the cationic constituents can be provided in the precursor composition as a metalorganic salt or metalorganic compound, and can be present in solution. The metalorganic solution can act as a solvent, or carrier, for the other solid-state elements or compounds. According to this embodiment, dispersants and/or binders can be substantially eliminated from the precursor composition. For example, the precursor composition can comprise ultrafine particles of rare-earth oxide and copper oxide in substantially a 1:3 stoichiometric ratio, along with a solublized barium-containing salt, for example, barium-trifluoroacetate dissolved in an organic solvent, such as methanol.

If the superconducting layer is of the REBCO type, the precursor composition can contain a rare earth element, barium, and copper in the form of their oxides; halides such as fluorides, chlorides, bromides and iodides; carboxylates and alcoholates, for example, acetates, including trihaloacetates such as trifluroracetates, formates, oxalates, lactates, oxyfluorides, propylates, citrates, and acetylacetonates, and, chlorates and nitrates. The precursor composition can include any combination of such elements (rare earth element, barium, and copper) in their various forms, which can convert to an intermediate containing a barium halide, plus rare earth oxyfluoride and copper(oxyfluoride) without a separate decomposition step or with a decomposition step that is substantially shorter than that which may be required for precursors in which all constituents are solubilized, and without substantial formation of $BaCO_3$, and which can subsequently be treated using high temperature reaction processes to yield an epitaxial REBCO film with $T_c$ of no less than about 89K, and $J_c$ greater than about 500,000 A/cm$^2$ at a film thickness of 1 micron or greater. For example, for a $YBa_2Cu_3O_{7-x}$ superconducting layer, the precursor composition could contain barium halide (for example, barium fluoride), yttrium oxide (for example, $Y_2O_3$), and copper oxide; or yttrium oxide, barium trifluoroacetate in a trifluoroacetate/methanol solution, and a mixture of copper oxide and copper trifluoroacetate in trifluoroacetate/methanol. Alternatively, the precursor composition could contain Ba-trifluoroacetate, $Y_2O_3$, and CuO. Alternatively, the precursor composition could contain barium trifluoroacetate and yttrium trifluoroacetate in methanol, and CuO. Alternatively, the precursor composition could contain $BaF_2$ and yttrium acetate and CuO. In some preferred embodiments, barium-containing particles are present as $BaF_2$ particles, or barium fluoroacetate. In some embodiments the precursor could be substantially a solublized metalorganic salt containing some or all of the cation constituents, provided at least a portion of one of the compounds containing cation constituents present in solid form. In certain embodiments, the precursor in a dispersion includes a binder and/or a dispersant and/or solvent(s).

The precursor compositions can be applied to substrate or buffer-treated substrates by a number of methods, which are designed to produce coatings of substantially homogeneous thickness. For example, the precursor compositions can be applied using spin coating, slot coating, gravure coating, dip coating, tape casting, or spraying. The substrate is desirably uniformly coated to yield a superconducting film of from about 1 to 10 microns, preferably from about 1 to 5 microns, more preferably from about 2 to 4 microns.

More details are provided in commonly owned U.S. patent application Ser. No. 09/500,717, filed on Feb. 9, 2000, and entitled "Coated Conductor Thick Film Precursor," which is hereby incorporated by reference in its entirety.

In embodiments in which layer 16 is formed of a superconductor material, the critical current density of the combined layers 14 and 16 in article 20 can be relatively high. Preferably, the critical current density of the combined layers 14 and 16 in article 20 is at least about $5 \times 10^5$ Amperes per square centimeter, more preferably at least about $1 \times 10^6$ Amperes per square centimeter, such as at least about $2 \times 10^6$ Amperes per square centimeter as determined by transport measurement at 77K in self field using a 1 micro Volt per centimeter criterion.

Figure 3:
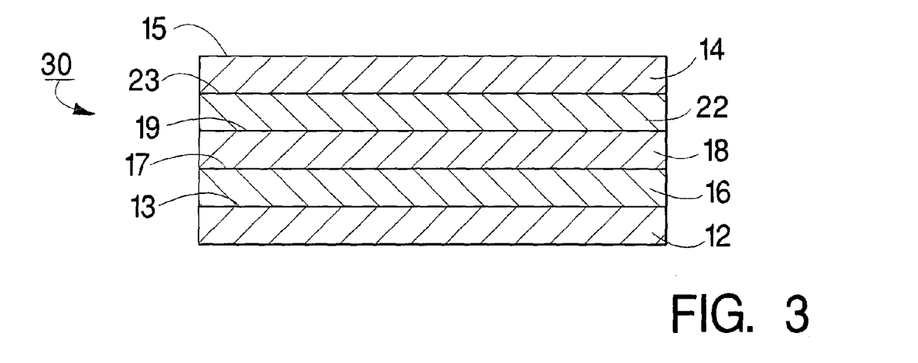
FIG. 3 is a cross-sectional view of a further embodiment of a multi-layer article.

While the foregoing discussion has described multi-layer articles having two layers of material (i.e., no intermediate layer) and three layers of material (i.e., one intermediate layer), the invention is not limited in this sense. Instead, multiple intermediate layers can be used. Each of the intermediate layers can be formed of a buffer layer material or a superconductor material. For example, FIG. 3 shows a multi-layer superconductor 30 according to yet another embodiment of the invention. Article 30 includes layers 12, 14 and 16. Article 30 further includes an additional intermediate layer(s) 18 and 22 having surfaces 19 and 23, respectively. Layers 18 and 22 are disposed between layers 16 and 14. Each of layers 16, 18 and 22 can be formed of a buffer layer material or a superconductor material. Moreover, surfaces 19 and 23 can be prepared using the methods discussed herein.

In preferred embodiments, a superconductor article includes three buffer layers between the substrate and superconductor material. A layer of $Y_2O_3$ or $CeO_2$ (e.g., from about 20 nanometers to about 50 nanometers thick) is deposited (e.g., using electron beam evaporation) onto the substrate surface. A layer of YSZ (e.g., from about 0.2 micron to about 1 micron thick, such as about 0.5 micron thick) is deposited onto the surface of the $Y_2O_3$ or $CeO_2$ layer using sputtering (e.g, using magnetron sputtering). A $CeO_2$ layer (e.g., about 20 nanometers thick) is deposited (e.g, using magnetron sputttering) onto the YSZ surface. One or more of the buffer layers can be chemically and/or thermally conditioned as described herein.

Superconductor articles according to the invention can also include a layer of a cap material which can be formed of a metal or alloy whose reaction products with the superconductor material (e.g., $YBa_2Cu_3O_{7-x}$) are thermodynamically unstable under the reaction conditions used to form the layer of cap material. Exemplary cap materials include silver, gold, palladium and platinum.

In addition, while the foregoing discussion has described multi-layer articles having certain structures, the invention is not limited in this sense. For example, in some embodiments, multi-layer high temperature superconductors are provided, including first and second high temperature superconductor coated elements. Each element includes a substrate, at least one buffer layer deposited on the substrate, a high temperature superconductor layer, and optionally a cap layer. The first and second high temperature superconductor coated elements can be joined at the first and second cap layers, or can be joined with an intervening, preferably metallic, layer. Exemplary joining techniques include soldering and diffusion bonding.

Such a multi-layer architecture provides improved current sharing, lower hysteretic losses under alternating current conditions, enhanced electrical and thermal stability, and improved mechanical properties. Useful conductors can be made having multiple tapes stacked relative to one another and/or laminated to provide sufficient ampacity, dimensional stability, and mechanical strength. Such embodiments also provide a means for splicing coated tape segments and for termination of coated tape stackups or conductor elements.

Moreover, it is expected that this architecture can provide significant benefits for alternating current applications. AC losses are shown to be inversely proportional to the effective critical current density within the conductor, more specifically, the cross-sectional area within which the current is carried. For a multifilimentary conductor, this would be the area of the "bundle" of superconducting filaments, excluding any sheath material around that bundle. For a "face-to-face" architecture, the "bundle" critical current density would encompass only the high temperature superconductor films and the thickness of the cap layer structure. The cap layer can be formed of one or more layers, and preferably includes at least one noble metal layer. "Noble metal," as used herein, is a metal, the reaction products of which are thermodynamically unstable under the reaction conditions employed to prepare the HTS tape. Exemplary noble metals include, for example, silver, gold, palladium, and platinum. Noble metals provide a low interfacial resistance between the HTS layer and the cap layer. In addition, the cap layer can include a second layer of normal metal (for example, copper or aluminum or alloys of normal metals). In direct current applications, additional face-to-face wires would be bundled or stacked to provide for the required ampacity and geometry for a given application.

Additionally, the high temperature superconductor film on the surface of the tapes could be treated to produce local breaks, that is, non-superconducting regions or stripes in the film only along the length of the tape (in the current flow direction). The cap layer deposited on the high temperature superconductor film would then serve to bridge the nonsuperconducting zones with a ductile normal metal region. An offset in the edge justification of the narrow strips or filaments, similar to a running bond brick pattern, would allow current to transfer to several narrow superconducting filaments both across the cap layers and to adjacent filaments, further increasing the redundancy and improving stability.

In all embodiments, a normal metal layer could be included along the edge of the conductor to hermetically seal the high temperature superconductor films and to provide for current transfer into the film, and if necessary, from the film into the substrate.

More details are provided in commonly owned U.S. Provisional Patent Application Ser. No. 60/145,468, filed on Jul. 23, 1999, and entitled "Enhanced High Temperature Coated Superconductors," and commonly owned U.S. patent application Ser. No. 09/617,518, filed concurrently herewith, and entitled "Enhanced High Temperature Coated Superconductors," both of which are hereby incorporated by reference in its entirety.

In some embodiments, coated conductors can be fabricated in a way that minimizes losses incurred in alternating current applications. The conductors are fabricated with multiple conducting paths, each of which comprises path segments which extend across at least two conducting layers, and further extend between these layers.

Each superconducting layer has a plurality of conductive path segments extending across the width of the layer, from one edge to another, and the path segments also have a component of direction along the length of the superconducting layer. The path segments in the superconducting layer surface are in electrically conductive communication with interlayer connections, which serve to allow current to flow from one superconducting layer to another. Paths, which are made up of path segments, are periodically designed, so that current flow generally alternates between two superconducting layers in bilayered embodiments, and traverses the layers through interlayer connections.

Superconducting layers can be constructed to contain a plurality of path segments which extend both across their widths and along their lengths. For example, superconducting layers can be patterned so as to achieve a high resistivity or a fully insulating barrier between each of the plurality of path segments. For example, a regular periodic array of diagonal path segments can be imposed on the layer along the full length of the tape. Patterning of superconducting layers to give such arrays can be accomplished by a variety of means known to those skilled in the art, including for example, laser scribing, mechanical cutting, implantation, localized chemical treatment through a mask, and other known methods. Further, the superconducting layers are adapted to allow the conductive path segments in their surfaces to electrically communicate with conducting interlayer connections passing between the layers, at or near their edges. The interlayer connections will typically be normally conducting (not superconducting) but in special configurations could also be superconducting. Interlayer connections provide electrical communication between superconducting layers which are separated by non-conducting or highly resistive material which is positioned between the superconducting layers. Such non-conducting or highly resistive material can be deposited on one superconducting layer. Passages can be fabricated at the edges of the insulating material to allow the introduction of interlayer connections, followed by deposition of a further superconducting layer. One can achieve a transposed configuration with coated conductors by patterning a superconducting layer into filaments parallel to the axis of the tape and winding the tape in a helical fashion around a cylindrical form.

More details are provided in commonly owned U.S. patent application Ser. No. 09/500,718, filed on Feb. 9, 2000, and entitled "Coated Conductors with Reduced AC Loss," which is hereby incorporated by reference in its entirety.

The following examples are illustrative only. In these examples, magnetron sputtering was conducted using a magnetron sp uttering power density of from about 25 Watts per square inch to about 50 Watts per square inch and a chamber pressure of from about 10 milliTorr to about 25 milliTorr.

EXAMPLE I

A precursor solution was prepared as follows. About 51.4 grams of $Y(CH_3CO_2)_3 \cdot 4H_2O$ were dissolved in about 514 grams of water. About 77.6 grams of $Ba(CH_3CO_2)_2$ were dissolved in about 388 grams of water, and about 91 grams of $Cu(CH_3CO_2)_2$—$H_2O$ were dissolved in about 1365 grams of water. These three solutions were then mixed together. About 243 grams of the resulting solution were mixed with about 10 milliliters of pure trifluoroacetic acid. This solution was dried under vacuum at about 60° C. until all solvents were removed and only a solid remained. The solid was then dissolved in methanol and diluted to a total volume of about 50 milliliters to form a precursor solution.

EXAMPLE II

A multi-layer article was prepared as follows. The precursor solution prepared in Example I was spin coated onto a buffered substrate formed of $CeO_2/YSZ/CeO_2/Ni$.

The buffered substrate was prepared by rolling deformation of a nickel sample to greater than about 97% to form a tape. The tape was annealed at about 1000° C. for about an hour to form a well cube textured material. An about 30 nanometer thick layer of $CeO_2$ was deposited onto the textured nickel surface at a rate of about one Angstrom per second using electron beam evaporation and a temperature of about 625° C. An about 300 nanometer thick layer of YSZ was deposited on the $CeO_2$ layer at a rate of about 0.5 Angstroms per second using radio frequency sputtering at a temperature of about 725° C. An about 20 nanometer thick layer of $CeO_2$ was deposited on the YSZ layer at a rate of about 0.7 Angstroms per second using radio frequency sputtering and a temperature of about 725° C.

Prior to spin coating the precursor solution on the $CeO_2/YSZ/CeO_2/Ni$ buffered substrate, the $CeO_2/YSZ/CeO_2/Ni$ buffered substrate was held at about 900° C. for about one hour in a gas environment having a nominal total gas pressure of about 760 Torr of a forming gas (about four volume percent hydrogen in argon). The gas environment had a nominal oxygen gas pressure of from about $1\times10^{-12}$ Torr to about $1\times10^{-16}$ Torr.

The spin coating protocol was as follows. The buffered $CeO_2/YSZ/CeO_2/Ni$ substrate was ramped from about zero revolutions per minute (RPM) to about 2000 RPM in about 0.5 second. The spin speed was held at about 2000 RPM for about five seconds and then ramped to about 4000 RPM in about 0.5 second. The spin speed was held at about 4000 RPM for about 60 seconds then reduced to about zero RPM.

The coated sample was decomposed as follows. The sample was heated from room temperature to about 210° C. at a rate of about 10° C. per minute in a nominal gas environment having a total gas pressure of about 760 Torr (water vapor pressure of about 24 Torr and balance oxygen). Heating was conducted in an about 2.25" diameter furnace using a gas flow rate of about 4.5 standard cubic feet per hour. While keeping substantially the same nominal gas environment, the temperature was increased to about 220° C. at a rate of about 0.05° C. per minute, followed by heating to about 400° C. at a rate of about 5° C. per minute to form an intermediate layer.

After decomposition, the intermediate layer was heated to about 725° C. at a rate of about 10° C. per minute and held for about three hours in an environment having a nominal total gas pressure of about 760 Torr (water vapor pressure of about 17 Torr, oxygen gas pressure of about 76 milliTorr and balance nitrogen), followed by holding the temperature at about 725° C. for about 10 minutes in an environment having a nominal total gas pressure of about 760 Torr (oxygen gas pressure of about 76 milliTorr and balance nitrogen). The layer was then cooled to about 450° C. in the same nominal gas environment. The layer was held at about 450° C. for about one hour in a gas environment having a nominal total pressure of about 760 Torr (about 760 Torr oxygen), and subsequently cooled to room temperature.

The resulting $YBa_2Cu_3O_{7-x}$ layer had a critical current density of about $1.34\times10^6$ Amperes per square centimeter as determined by transport measurement at 77K in self field using a one microvolt per centimeter criterion.

EXAMPLE III

A multi-layer article was prepared as follows. A buffered substrate was prepared using the process parameters described in Example II except that: 1.) the $CeO_2$ layer adjacent the textured nickel substrate was replaced with an about 100 nanometer thick layer of $Y_2O_3$ deposited at a rate of about one Angstrom per second using electron beam evaporation and a temperature of about 700° C.; and 2.) the outer layer of $CeO_2$ was deposited at a rate of about 0.35 Angstroms per second. A precursor solution prepared as described in Example I was spin coated and decomposed on the $CeO_2$/YSZ/$Y_2O_3$/Ni buffered substrate using the protocol described in Example II to form an intermediate layer. The intermediate layer was removed by exposure to an about one percent aqueous nitric acid solution at room temperature for about four minutes. The surface of the $CeO_2$ layer on which the intermediate layer had been formed was thus chemically conditioned. A precursor solution prepared as described in Example I was then spin coated on the conditioned $CeO_2$ layer, decomposed and further heated using the protocol described in Example II. The $YBa_2Cu_3O_{7-x}$ layer had a critical current density of about $1.93 \times 10^6$ Amperes per square centimeter as determined by transport measurement at 77K in self field using a one microvolt per centimeter criterion.

EXAMPLE IV

A multi-layer article was prepared as follows. A $CeO_2$/YSZ/$CeO_2$/Ni buffered substrate prepared as described in Example II was exposed to an about one percent aqueous nitric acid solution at room temperature for about seven minutes to chemically condition the surface of the outer layer of $CeO_2$. A precursor solution prepared as described in Example I was then spin coated onto the conditioned $CeO_2$ surface, decomposed and further heated as described in Example II. The $YBa_2Cu_3O_{7-x}$ layer had a critical current density of about $1.10 \times 106$ Amperes per square centimeter as determined by transport measurement at 77K in self field using a one microvolt per centimeter criterion.

EXAMPLE V

A multi-layer article was prepared as follows. An about 20 nanometer thick layer of $CeO_2$ was sputter deposited on a YSZ[100] single crystal surface at a rate of about 0.35 Angstroms per second at a temperature of about 725° C. The $CeO_2$/YSZ[100] buffered substrate was heated to about 950° C. for about 60 minutes in a total gas pressure of about 760 Torr of a forming gas (about four volume percent hydrogen, from about Torr to about $1 \times 10^{-16}$ Torr oxygen, and balance argon). A layer of $YBa_2Cu_3O_{7-x}$ was then formed on the surface of the $CeO_2$/YSZ[100] buffered substrate by spin coating a precursor solution prepared as described in Example I using the process parameters described in Example II except that: 1.) the intermediate layer was held at about 765° C. for about one hour in the water vapor/oxygen/nitrogen environment rather than about 725° C. for about three hours in the water vapor/oxygen/nitrogen environment; and 2.) the intermediate layer was held at about 765° C. for about ten minutes in the oxygen/nitrogen environment rather than about 725° C. for about ten minutes in the oxygen/nitrogen environment. The $YBa_2Cu_3O_{7-x}$ layer had a critical current density of about $4.2 \times 10^6$ Amperes per square centimeter as determined by transport measurement at 77K in self field using a one microvolt per centimeter criterion.

EXAMPLE VI

A precursor solution was prepared as follows. About 10.27 grams of $Y(CH_3CO_2)_{30} \cdot 4H_2O$ were dissolved in about 77 grams of water. About 15.52 grams of $Ba(CH_3CO_2)_2$ were dissolved in about 77 grams of water, and about 17.20 grams of $Cu(CH_3CO_2)_2 \cdot H_2O$ were dissolved in about 182 grams of water. These three solutions were then mixed together, and about 8.3 grams of pure trifluoroacetic acid were added. The resulting solution was dried under vacuum at about 60° C. until all solvents were removed and only a solid remained. The solid was then dissolved in methanol and diluted with methanol to a total volume of about 100 milliliters to form a precursor solution.

EXAMPLE VII

A precursor solution was prepared as follows. About 51.4 grams of $Y(CH_3CO_2)_{30.4}H_2O$ were dissolved in about 514 grams of water. About 77.6 grams of $Ba(CH_3CO_2)_2$ were dissolved in about 388 grams of water, and about 91 grams of $Cu(CH_3CO_2)_2$—$H_2O$ were dissolved in about 1365 grams of water. These three solutions were then mixed together. About 243 grams of the resulting solution were mixed with about 10 milliliters of pure trifluoroacetic acid. This solution was dried under vacuum at about 60° C. until all solvents were removed and only a solid remained. The solid was then re-dissolved in about 100 milliliters of water and dried under vacuum at about 60° C. until all solvents were removed and only a solid remained. This was repeated a total of seven times to ensure removal of all free acid. The solid was then dissolved in methanol and diluted with methanol to a total volume of about 50 milliliters to form a precursor solution.

EXAMPLE VIII

A multi-layer article was prepared by spin coating the precursor solution of Example I on a $SrTiO_3(100)$ oriented single crystal following the protocol described in Example II. The coated sample was heated to about 210° C. at a rate of about 10° C. per minute in a gas environment having a nominal total pressure of about 760 Torr (about 24 Torr water vapor and balance oxygen). The heating was performed in an about 2.25" diameter furnace using a gas flow rate of about 4.5 standard cubic feet per hour. Using substantially the same nominal gas environment, the temperature was then increased to about 220° C. at a rate of about 0.05° C. per minute, followed by heating to about 400° C. at a rate of about 5° C. per minute. The layer was then heated to about 735° C. at a rate of about 10° C. per minute in a gas environment having a nominal total pressure of about 760 Torr (about 76 milliTorr oxygen, about 17 Torr water vapor and balance nitrogen). The layer was kept under these conditions for about three hours. The layer was then held at about 735° C. for about 10 minutes in a gas environment having a nominal total gas pressure of about 760 Torr (about 0.076 Torr oxygen and balance nitrogen). Using substantially the same nominal gas environment, the layer was cooled to about 450° C. The layer was held at about 450° C. for about one hour in about 760 Torr oxygen, and then cooled to room temperature. The $YBa_2Cu_3O_{7-x}$ layer had a critical current density of about $3.4 \times 10^6$ Amperes per square centimeter as determined by transport measurement at 77K in self field using a one microvolt per centimeter criterion.

EXAMPLE IX

A multi-layer article was prepared as described in Example VIII except that the precursor solution described in Example VI was used. The $YBa_2Cu_3O_{7-x}$ llayer had a critical current density of about $3.3 \times 10^6$ Amperes per square centimeter as determined by transport measurement at 77K in self field using a one microvolt per centimeter criterion.

EXAMPLE X

A multi-layer article was prepared as described in Example VIII except that the precursor solution described in Example VII was used. The $YBa_2Cu_3O_{7-x}$ layer had a critical current density of about $2.85 \times 10^6$ Amperes per square centimeter as determined by transport measurement at 77K in self field using a one microvolt per centimeter criterion.

EXAMPLE XI

A precursor solution was prepared as follows. About 1.36 grams of $Y(CF_3CO_2)_3 \cdot 0.4H_2O$, about 2.46 grams of $Ba(CF_3CO_2)_2$ and about 2.51 grams of $Cu(CF_3CO_2)_2$—$H_2O$ were dissolved in about five milliliters of methanol. About 0.86 milliliters of water was then added and the total volume of the solution was adjusted to about 10 milliliters with methanol.

EXAMPLE XII

A multi-layer article was prepared as follows. A precursor solution prepared as described in Example XI was spin coated onto a $CeO_2/YSZ(100)$ single crystal buffered substrate using the protocol described in Example II. The buffered substrate was prepared by sputter depositing an about 20 nanometer layer of $CeO_2$ onto the YSZ(100) at a rate of about 0.35 Angstroms per second at a temperature of about 725° C. Prior to deposition of the precursor solution, the sample was heated to about 950° C. for about one hour in an environment having a nominal total gas pressure of about 760 Torr of a forming gas (about four volume percent hydrogen in argon). The gas environment had a nominal oxygen gas pressure of from about $1 \times 10^{-12}$ Torr to about $1 \times 10^{-16}$ Torr.

The coated sample was decomposed as follows. The sample was heated from room temperature to about 210° C. at a rate of about 10° C. per minute in a nominal gas environment having a total gas pressure of about 760 Torr (water vapor pressure of about 24 Torr and balance oxygen). An about 2.25" diameter furnace was used, and the gas flow rate was about 4.5 standard cubic feet per hour. While keeping substantially the same nominal gas environment, the temperature was increased to about 220° C. at a rate of about 0.05° C. per minute, followed by heating to about 400° C. at a rate of about 5° C. per minute to form an intermediate layer. The intermediate layer was then heated to about 765° C. at a rate of about 10° C. per minute in a gas environment having a nominal total pressure of about 760 Torr (about 76 milliTorr oxygen, about 17 Torr water vapor and balance nitrogen). The layer was held under these conditions for about seventy minutes. The layer was then held at about 765° C. for about 10 minutes in a gas environment having a nominal total gas pressure of about 760 Torr (about 0.076 Torr oxygen and balance nitrogen). Using substantially the same nominal gas environment, the layer was cooled to about 450° C. The layer was held at about 450° C. for about one hour in an environment having a nominal total gas pressure of about 760 Torr (about 760 Torr oxygen), and then cooled to room temperature. The $YBa_2Cu_3O_{7-x}$ layer had a critical current density of about $4.3 \times 10^6$ Amperes per square centimeter as determined by transport measurement at 77K in self field using a one microvolt per centimeter criterion.

EXAMPLE XIII

A precursor solution was prepared as follows. About 1.36 grams of $Y(CF_3CO_2)_3 \cdot 4H_2O$, about 1.53 grams of $Ba(CH_3CO_2)_2$ and about 2.51 grams of $Cu(CF_3CO_2)_2 \cdot H_2O$ were dissolved in about five milliliters of methanol. About 1.14 milliliters of water was then added and the total volume of the solution was adjusted to about 10 milliliters with methanol.

EXAMPLE XIV

A precursor solution was prepared as follows. About 3.50 grams of $Y(CF_3CO_2)_3 \cdot 4H_2O$, about 6.15 grams of $Ba(CF_3CO_2)_2$ and about 6.40 grams of $Cu(CF_3CO_2)_2$—$H_2O$ were dissolved in about 25 milliliters of methanol.

EXAMPLE XV

A precursor solution was prepared as follows. About 1.36 grams of $Y(CF_3CO_2)_3 \cdot 0.4H_2O$, about 2.46 grams of $Ba(CF_3CO_2)_2$ and about 2.51 grams of $Cu(CF_3CO_2)_2$—$H_2O$ were dissolved in about five milliliters of methanol. About 2.67 milliliters of water was then added and the total volume of the solution was adjusted to about 110 milliliters with methanol.

EXAMPLE XVI

A precursor solution was prepared as follows. About 1.82 grams of $Y(CF_3CO_2)_3 \cdot 0.4H_2O$, about 3.28 grams of $Ba(CF_3CO_2)_2$ and about 3.34 grams of $Cu(CF_3CO_2)_2 \cdot H_2O$ were dissolved in about five milliliters of methanol. About 1.14 milliliters of water was then added and the total volume of the solution was adjusted to about 10 milliliters with methanol.

EXAMPLE XVII

A precursor solution was prepared as follows. About 1.50 grams of $Y(CF_3CO_2)_3 \cdot 4H_2O$, about 2.46 grams of $Ba(CF_3CO_2)_2$ and about 2.51 grams of $Cu(CF_3CO_2)_2 \cdot H_2O$ were dissolved in about five milliliters of methanol. About 1.14 milliliters of water was then added and the total volume of the solution was adjusted to about 10 milliliters with methanol.

EXAMPLE XVIII

A precursor solution was prepared as follows. About 1.36 grams of $Y(CF_3CO_2)_3 \cdot 0.4H_2O$, about 2.46 grams of $Ba(CF_3CO_2)_2$ and about 2.51 grams of $Cu(CF_3CO_2)_2 \cdot H_2O$ were dissolved in about five milliliters of 2-methoxyethanol. About 1.14 milliliters of water was then added and the total volume of the solution was adjusted to about 10 milliliters with 2-methoxythanol.

EXAMPLE XIX

A multi-layer article was prepared as follows. A precursor solution prepared as described in Example VI was spin coated onto the surface of a (100)SrTiO$_3$ using the protocol described in Example II. The sample was heated to about 190° C. at about 10° C. per minute in a gas environment having a nominal total pressure of about 760 Torr (about 17 Torr water vapor pressure and balance oxygen). Heating was performed in an about 2.25" diameter furnace using a gas flow rate of about 4.5 standard cubic feet per hour. The sample was then heated to about 290° C. at a rate of about 0.16° C. per minute, followed by heating to about 400° C. at a rate of about 5° C. per minute to form an intermediate layer. The intermediate layer was heated to about 785° C. at a rate of about 10° C. per minute in a gas environment having a nominal total pressure of about 760 Torr (about 0.76 Torr oxygen, about 17 Torr water vapor and balance nitrogen). The sample was then held at about 785° C. for about 10 minutes in a gas environment having a nominal total pressure of about 760 Torr (oxygen pressure of about 0.76 Torr balance nitrogen). The layer was cooled to about 450° C. and held at about 450° C. for about one hour in a gas environment having a nominal total pressure of about 760 Torr (about 760 Torr oxygen). The resulting layer of YBa$_2$Cu$_3$O$_{7-x}$ layer was about 0.8 microns thick and had a critical current density of about 0×10$^6$ Amperes per square centimeter as determined by transport measurement at 77K in self field using a one microvolt per centimeter criterion.

EXAMPLE XX

A multi-layer article was prepared as described in Example XIX except that a precursor prepared as described in Example VI was spin coated onto the YBa$_2$Cu$_3$O$_{7-x}$ layer, decomposed and further heated as described in Example XIX. The combined thickness of the YBa$_2$Cu$_3$O$_{7-x}$ layers was about 1.7 microns. The critical current density of the combined two superconductor layers was about 0.63×10$^6$ Amperes per square centimeter as determined by transport measurement at 77K in self field using a one microvolt per centimeter criterion.

EXAMPLE XXI

A CeO$_2$/YSZ/CeO$_2$/Ni buffered substrate was prepared as follows. The Ni layer was prepared as described in Example II. The CeO$_2$/YSZ/CeO$_2$ layers were deposited at Oak Ridge National Laboratory. The CeO$_2$/YSZ/CeO$_2$/Ni buffered substrate was thermally conditioned by being held at about 950° C. for about one hour in a gas environment having a nominal total gas pressure of about 760 Torr (17 Torr water and forming gas (about five volume percent hydrogen in argon)). The gas environment had a nominal oxygen gas pressure of from about 1×10$^{-12}$ Torr to about 1×10$^{-16}$ Torr.

Using the process parameters of Example II, a precursor solution prepared as described in Example I was spin coated onto the thermally conditioned surface of the CeO$_2$/YSZ/CeO$_2$/Ni buffered substrate, and then decomposed to form a substantially defect-free intermediate layer.

The intermediate layer was heated to about 725° C. at a rate of about 10° C. per minute and held for about three hours in an environment having a nominal total gas pressure of about 760 Torr (water vapor pressure of about 17 Torr, oxygen gas pressure of about 76 milliTorr and balance nitrogen), followed by holding the temperature at about 725° C. for about 10 minutes in an environment having a nominal total gas pressure of about 760 Torr (oxygen gas pressure of about 76 milliTorr, about 5 milliTorr water, and balance nitrogen). The layer was then cooled to about 450° C. in the same nominal gas environment. The layer was held at about 450° C. for about one hour in a gas environment having a nominal total pressure of about 760 Torr (about 760 Torr oxygen), and subsequently cooled to room temperature to form a YBa$_2$Cu$_3$O$_{7-x}$ layer.

The YBa$_2$Cu$_3$O$_{7-x}$ layer had a critical current density of about 1.5×10$^6$ Amperes per square centimeter as determined by transport measurement at 77K in self field using a one micro Volt per centimeter criterion.

EXAMPLE XXII

A CeO$_2$/YSZ/Y$_2$O$_3$/Ni buffered substrate was prepared as follows. The Ni substrate was prepared as described in Example II. The Y$_2$O$_3$ layer was about 100 nanometers thick and was deposited at a rate of about 0.1 Angstrom per second at a temperature of about 650° C. using electron beam evaporation. The YSZ layer was about 700 nanometers thick and was deposited at a rate of about 0.1 Angstrom per second at a temperature of about 700° C. using magnetron sputtering. The Ce$_2$O$_3$ layer was about 19.2 nanometers thick and was deposited at a rate of about 0.6 Angstrom per second at a temperature of about 700° C. using magnetron sputtering. The CeO$_2$/YSZ/Y$_2$O$_3$/Ni buffered substrate was thermally conditioned as described in Example XXI. Using the process parameters of Example II, a precursor solution prepared as described in Example I was spin coated onto the conditioned surface of the CeO$_2$/YSZ/Y$_2$O$_3$/Ni buffered substrate, and then decomposed to form a substantially defect-free intermediate layer.

The intermediate layer was heat treated as described in Example XXI to form a YBa$_2$Cu$_3$O$_{7-x}$ layer. The YBa$_2$Cu$_3$O$_{7-x}$ layer had a critical current density of about 1.0×10$^6$ Amperes per square centimeter as determined by transport measurement at 77K in self field using a one microvolt per centimeter criterion.

EXAMPLE XXIII

A multi-layer article was prepared as follows. A buffered substrate was prepared using the process parameters described in Example XXII except that the Y$_2$O$_3$ layer was replaced with an about 100 nanometer thick layer of Gd$_2$O$_3$ deposited from a gadolinium alkoxides solution in a forming gas environment.

The CeO$_2$/YSZ/Gd$_2$O$_3$/Ni buffered substrate was thermally conditioned as described in Example XXI. Using the process parameters of Example II, a precursor solution prepared as described in Example I was spin coated onto the thermally conditioned surface of the CeO$_2$/YSZ/Gd$_2$O$_3$/Ni buffered substrate, and then decomposed to form a substantially defect-free intermediate layer.

The intermediate layer was heat treated as described in Example XXI to form a YBa$_2$Cu$_3$O$_{7-x}$ layer. The YBa$_2$Cu$_3$O$_{7-x}$ layer had a critical current density of about 1.5×10$^6$ Amperes per square centimeter as determined by transport measurement at 77K in self field using a one microvolt per centimeter criterion.

While the foregoing discussion has described the invention with respect to certain embodiments of superconductors and methods of making such articles, the invention is not limited in this sense. For example, the invention can relate to semiconductor articles and methods of making semiconductor articles or multi-layer articles that are electroceramics which include one or more ferroelectric layers.

Other embodiments are in the claims.

What is claimed is:

1. A composition, comprising:
   a first salt of a first metal;
   a second salt of a second metal;
   a third salt of a rare earth metal,
   wherein at least one of the first, second and third salts comprises a trifluoroacetate and the composition has a total free acid concentration of less than about $1 \times 10^{-3}$ molar.

2. The composition of claim 1, wherein the composition has a total free acid concentration of less than about $1 \times 10^{-5}$ molar.

3. The composition of claim 1, wherein the composition has a total free acid concentration of about $1 \times 10^{-7}$ molar.

4. The composition of claim 1, wherein the composition has a mole ratio of fluorine to the second metal of at least about two.

5. The composition of claim 1, wherein the composition has a mole ratio of fluorine to the second metal of from about two to about 18.5.

6. The composition of claim 1, wherein the composition has a mole ratio of fluorine to the second metal of from about two to about 10.

7. The composition of claim 1, wherein the first metal comprises copper and the second metal is selected from the group consisting of barium, strontium and calcium.

8. The composition of claim 7, wherein the rare earth metal comprises yttrium.

9. The composition of claim 1, wherein the first metal comprises copper, the second metal comprises barium and the third metal comprises yttrium.

10. The composition of claim 9, wherein a ratio of copper atoms to barium atoms to yttrium atoms contained in the solution is about 3:2:1.

11. The composition of claim 1, wherein the composition is disposed on a surface of a layer.

12. The composition of claim 11, wherein the layer comprises a material selected from the group consisting of a substrate, a buffer layer and a superconductor layer.

13. The composition of claim 1, further comprising water, wherein the composition has a water content of less than about 50 volume percent.

14. The composition of claim 13, wherein the water content is less than about 35 volume percent.

15. The composition of claim 13, wherein the water content is less than about 25 volume percent.

16. The composition of claim 1, wherein at least two of the first, second and third salts comprises trifluoroacetates.

17. The composition of claim 1, wherein each of the first, second and third salts comprise trifluoroacetates.

18. A composition, comprising:
    a first salt of a first metal;
    a second salt of a second metal;
    a third salt of a rare earth metal,
    wherein at least one of the first, second and third salts comprises a trifluoroacetate and the composition has a mole ratio of fluorine to the second metal of from about two to about 18.5.

19. The composition of claim 18, wherein the composition has a mole ratio of fluorine to the second metal of from about two to about 10.

20. The composition of claim 18, wherein the first metal comprises copper and the second metal is selected from the group consisting of barium, strontium and calcium.

21. The composition of claim 20, wherein the rare earth metal comprises yttrium.

22. The composition of claim 18, wherein the first metal comprises copper, the second metal comprises barium and the third metal comprises yttrium.

23. The composition of claim 22, wherein a ratio of copper atoms to barium atoms to yttrium atoms contained in the solution is about 3:2:1.

24. The composition of claim 18, wherein the composition is disposed on a surface of layer.

25. The composition of claim 24, wherein the layer comprises a material selected from the group consisting of a substrate, a buffer layer and a superconductor layer.

26. The composition of claim 18, further comprising water, wherein the composition has a water content of less than about 50 volume percent.

27. The composition of claim 26, wherein the water content is less than about 35 volume percent.

28. The composition of claim 26, wherein the water content is less than about 25 volume percent.

29. The composition of claim 18, wherein at least two of the first, second and third salts comprises trifluoroacetates.

30. The composition of claim 18, wherein each of the first, second and third salts comprise trifluoroacetates.

* * * * *